United States Patent
Fiorito et al.

(10) Patent No.: US 7,308,365 B2
(45) Date of Patent: Dec. 11, 2007

(54) AUTOMATED PROJECTION SPECTROSCOPY (APSY)

(76) Inventors: Francesco Fiorito, Salita Viarno 23D, CH- 6963 Lugano (CH); Sebastian Hiller, Bertastrasse 19, CH-8003 Zurich (CH); Gerhard Wider, Humrigenflurstr. 48 A, CH-8704 Herrliberg (CH); Kurt Wüthrich, Fliederstrasse 7, CH-8304 Wallisellen (CH)

( * ) Notice: Subject to any disclaimer, the term of this patent is extended or adjusted under 35 U.S.C. 154(b) by 0 days.

(21) Appl. No.: 11/439,161

(22) Filed: May 24, 2006

(65) Prior Publication Data

US 2006/0273797 A1 Dec. 7, 2006

(30) Foreign Application Priority Data

Jun. 4, 2005 (EP) ................... 05012094

(51) Int. Cl.
*G06F 19/00* (2006.01)
(52) U.S. Cl. .................... 702/27; 324/307; 324/309; 703/2
(58) Field of Classification Search ................. 702/19, 702/27, 29, 30; 703/2, 11, 12; 324/307, 324/309
See application file for complete search history.

(56) References Cited

U.S. PATENT DOCUMENTS

| | | | |
|---|---|---|---|
| 5,341,098 A * | 8/1994 | Hennig | 324/309 |
| 5,545,991 A * | 8/1996 | Nauerth | 324/307 |
| 2003/0065490 A1* | 4/2003 | Lowry | 703/2 |

FOREIGN PATENT DOCUMENTS

WO    WO 03/027700    4/2003

OTHER PUBLICATIONS

H. Shen, F.M. Poulsen "Group theoretical projection operators and symmetry-adapted functions in NMR spectral analysis". Journal of Magnetic Resonance, vol. 97, Apr. 1992, pp. 385-390.

K. Nagayama et al. "The use of cross-sections and of projections in two-dimensional NMR spectroscopy". Journal of Magnetic Resonance, vol. 31, Jul. 1978, pp. 133-148.

H.N.B. Moseley et al. "A generalized approach to automated NMR peak list editing: application to reduce dimensionality triple resonance spectra". Journal of Magnetic Resonance, vol. 170, Oct. 2004, pp. 263-277.

(Continued)

*Primary Examiner*—John Barlow
*Assistant Examiner*—John H. Le

(57) ABSTRACT

A method of projection spectroscopy for N-dimensional NMR experiments with the following steps. Data recording through; a) selection of N-dimensional NMR experiments out of a group of N-dimensional experiments, selection of the dimensionalities ($D_i$) of the projections and unconstrained selection of j sets of projection angles, with $j \geq 2$; b) recording of discrete sets of j projections from the N-dimensional NMR experiments at the selected projection angles; c) peak picking and creating a peak list for each of the j projection spectra is characterized by d) automated identification of peaks in the projection spectra that arise from the same resonance in the N-dimensional spectrum ($N \geq 3$) using vector algebra to exploit geometrical properties of projections in the N-dimensional space, and computation of a N-dimensional peak list using vector algebra to exploit geometrical properties of projections in the N-dimensional space. A reliable method of automated projection spectroscopy without restrictions on projection angles and dimensionality is thereby realized.

9 Claims, 11 Drawing Sheets

Fig. 6

OTHER PUBLICATIONS

Thomas Szyperski et al. "Reduced-dimensionality NMR spectroscopy for high-throughput protein resonance assignment". PNAS, Jun. 11, 2002, vol. 99, No. 12, 8009-8014.

Thomas Szyperski et al. "Reduced Dimensionality in Triple-Resonance NMR Experiments". J. Am. Chem. Soc. 1993, 115, 9307-9308.

Ray Freeman et al. "Distant Echoes of the Accordion: Reduced Dimensionality, GFT-NMR, and Projection-Reconstruction of Multidimensional Spectra". Concepts in Magnetic Resonance Part A, vol. 23A(2) 63-75 (2004).

Seho Kim et al. "GFT NMR, a New Approach To Rapidly Obtain Precise High-Dimensional NMR Spectral Information". J. AM. Chem. Soc. 2003, 125, 1385-1393★ 1385.

Eriks Kupce et al. "Projection-Reconstruction Technique for Speeding up Multidimensional NMR Spectroscopy". J. AM. Chem. Soc. 2004, 126, 6429-6440★ 6429.

K. Nagayama et al. "The Use of Cross-Sections and of Projections in Two-dimensional NMR Spectroscopy". Journal of Magnetic Resonance 31, 133-148 (1978).

Stephan Grzesiek et al. "Improved 3D Triple-Resonance NMR Techniques Applied to a 31 kDa Protein". Journal of Magnetic Resonance 96, 432-440 (1992).

Torsten Herrmann et al. "Protein NMR structure determination with automated NOE-identification in the NOESY spectra using the new software ATNOS", Journal of Biomolecular NMR, 24: 171-189, (2002).

Hunter N. B. Moseley et al. "A generalized approach to automated NMR peak list editing: application to reduced dimensionality triple resonance spectra". Journal of Magnetic Resonance 170 (2004) 263-277.

* cited by examiner

| dim | $N = 5$ | $N = 4$ | $N = 3$ |
|---|---|---|---|
| $\omega_1$ | $\sin(\gamma)$ | $\sin(\beta)$ | $\sin(\alpha)$ |
| $\omega_2$ | $\sin(\beta)\cdot\cos(\gamma)$ | $\sin(\alpha)\cdot\cos(\beta)$ | $\cos(\alpha)$ |
| $\omega_3$ | $\sin(\alpha)\cdot\cos(\beta)\cdot\cos(\gamma)$ | $\cos(\alpha)\cdot\cos(\beta)$ | - |
| $\omega_4$ | $\cos(\alpha)\cdot\cos(\beta)\cdot\cos(\gamma)$ | - | - |

Tab. 1

|  | α | β | γ | SW [Hz] |
|---|---|---|---|---|
| a1 | 0° | 0° | 0° | 1550 |
| a2 | 90° | 0° | 0° | 1600 |
| a3 | 0° | 90° | 0° | 3600 |
| a4 | 0° | 0° | 90° | 2000 |
| a5 | 30° | 0° | 0° | 2142 |
| a6 | -30° | 0° | 0° | 2142 |
| a7 | 60° | 0° | 0° | 2161 |
| a8 | -60° | 0° | 0° | 2161 |
| a9 | 0° | 30° | 0° | 3142 |
| a10 | 0° | -30° | 0° | 3142 |
| a11 | 0° | 60° | 0° | 3893 |
| a12 | 0° | -60° | 0° | 3893 |
| a13 | 0° | 0° | 30° | 2342 |
| a14 | 0° | 0° | -30° | 2342 |
| a15 | 0° | 0° | 60° | 2507 |
| a16 | 0° | 0° | -60° | 2507 |
| a17 | 90° | 30° | 0° | 3186 |
| a18 | 90° | -30° | 0° | 3186 |
| a19 | 90° | 60° | 0° | 3918 |
| a20 | 90° | -60° | 0° | 3918 |
| a21 | 90° | 0° | 30° | 2386 |
| a22 | 90° | 0° | -30° | 2386 |
| a23 | 90° | 0° | 60° | 2532 |
| a24 | 90° | 0° | -60° | 2532 |
| a25 | 0° | 90° | 30° | 4118 |
| a26 | 0° | 90° | -30° | 4118 |
| a27 | 0° | 90° | 60° | 3532 |
| a28 | 0° | 90° | -60° | 3532 |

Tab. 2

| BMRB number | number of residues |
|---|---|
| 4070 | 205 |
| 4093 | 138 |
| 4188 | 138 |
| 4193 | 214 |
| 4198 | 161 |
| 4215 | 136 |
| 4288 | 105 |
| 4384 | 262 |
| 4572 | 75 |
| 4575 | 211 |
| 4599 | 161 |
| 4671 | 159 |
| 4679 | 165 |
| 4881 | 179 |
| 4913 | 115 |
| 4938 | 132 |
| 4959 | 148 |
| 5013 | 120 |
| 5177 | 166 |
| 5308 | 107 |
| 547 | 148 |
| 5540 | 148 |
| 5557 | 170 |
| 5598 | 102 |
| 5629 | 111 |
| 5761 | 119 |
| 5884 | 138 |
| 5928 | 140 |
| 5976 | 103 |
| 6125 | 228 |
| 6133 | 116 |
| 6236 | 117 |
| 6295 | 251 |
| 5560 | 116 |
| 4101 | 214 |
| 4267 | 179 |
| 4282 | 183 |
| 4321 | 166 |
| 4376 | 185 |
| 4848 | 240 |
| 4854 | 240 |
| 5054 | 165 |
| 5232 | 199 |
| 5316 | 288 |
| 5398 | 187 |
| 5483 | 187 |
| 5627 | 282 |
| 5668 | 187 |
| 5756 | 184 |
| 5823 | 242 |
| 6202 | 215 |
| 6241 | 182 |

Tab. 3

AUTOMATED PROJECTION SPECTROSCOPY (APSY)

This application claims Paris Convention priority of EP 05 012 094.8 filed Jun. 4, 2005 the entire disclosure of which is hereby incorporated by reference.

BACKGROUND OF THE INVENTION

The invention relates to a method of projection spectroscopy for N-dimensional (N≧3) NMR experiments with the following steps:
Data Recording Comprising
(a) selection of N-dimensional NMR experiments out of a group of N-dimensional experiments, selection of the dimensionalities of the projections and unconstrained selection of j sets of projection angles, with j≧2,
(b) recording of discrete sets of j projections from the N-dimensional NMR experiments at the selected projection angles,
(c) peak picking and creating a peak list for each of the j projection spectra.

A method of this type is known from reference [40] listed below).

In NMR studies of biological macromolecules in solution (see reference [1-4] as listed below), multidimensional NMR data are commonly acquired by sampling the time domain in all dimensions equidistantly at a resolution adjusted to the populated spectral regions (see reference [5] as listed below). With recent advances in sensitivity, due to high field strengths and/or cryogenic detection devices, the time required to explore the time domain in the conventional way typically exceeds by far the time needed for sensitivity considerations, so that the desired resolution in the indirect dimensions determines the duration of the experiment. In this situation of the "sampling limit", which is common in 3- and higher-dimensional experiments with small and medium-size proteins (see reference [6] as listed below), the desired chemical shift information has been collected using "unconventional" experimental schemes, such as non-uniform sampling of the time domain (see reference [7,8] as listed below) or combination of two or more indirect dimensions (see reference [9,10] as listed below).

The concept of combining indirect dimensions has lead to reduced-dimensionality experiments (see reference [9] as listed below) and G-Matrix Fourier transform (GFT) NMR (see reference [11, 12] as listed below). In GFT-NMR, several evolution periods of a multidimensional NMR experiment are combined, the data are processed using a G-matrix, and the resulting set of spectra is analyzed jointly to is identify the peaks that arise from the same spin system and to calculate their resonance frequencies (see reference [11] as listed below). In another approach, projection-reconstruction (PR-) NMR (see reference [13-16] as listed below), the projection—cross-section theorem (see reference [17, 18] as listed below) is combined with reconstruction methods from imaging techniques (see reference [19, 20] as listed below). In particular, a scheme for quadrature detection along tilted planes in the time domain allows the direct recording of orthogonal projections of any multidimensional experiment at arbitrary projection angles (see reference [15] as listed below). In PR-NMR, the full multidimensional spectrum is then reconstructed from the projections of the multidimensional spectral data (see reference [13-16] as listed below).

The analysis of complex NMR spectra typically involves intensive human interaction, and automation of NMR spectroscopy with macromolecules is still in development. Thereby the distinction of real peaks from random noise and spectral artifacts, as well as peak overlap represent major challenges (see reference [21-23, 40] as listed below).

The known methods show disadvantages like limitations on the possible number of projection angles and the requirement of manual interaction during operation. Further current automated methods can only handle the case N=3 and do not allow an easy extension to higher dimensions.

It is an object of the present invention to overcome the described disadvantages and to propose a reliable method of automated projection spectroscopy without restrictions on projection angles and dimensionality.

SUMMARY OF THE INVENTION

This object is achieved by a method comprising the following step:
(d) automated identification of peaks that arise from the same resonance in the N-dimensional spectrum using vector algebra to exploit geometrical properties of projections in the N-dimensional space, and computation of an N-dimensional peak list using vector algebra to exploit geometrical properties of projections in the N-dimensional space.

The invention presents a method for automated projection spectroscopy (APSY). This method for the automated analysis of projection spectra of N-dimensional NMR experiments results in the identification of peaks that arise from the same resonance in the N-dimensional spectrum. It is based on vector algebra and exploits geometrical properties of projections in the N-dimensional space. On principle grounds, automated analysis benefits from higher-dimensionality of the spectra, since the peaks are then more widely separated, and hence peak overlap is substantially reduced. APSY can be applied with any dimension N≧3 and there are no restrictions on the projection angles and on the number of projections.

In a preferred variant of the inventive method step (d) comprises:
(i) computation of candidate points, which are intersection points in the N-dimensional spectrum of subspaces arising from peaks in x selected peak lists from the j peak lists created in (c), where x is the smallest number that warrants the existence of intersection points.
(ii) calculation of a number of intersecting subspaces for each candidate point using all j peak lists,
(iii) creation of a peak subgroup list, by identification of all peaks that contribute to a selected candidate point,
(iv) repetition of steps (i) to (iii) k−1 times, where k≧1,
(v) merging of the k peak subgroup lists,
(vi) calculation of the peak positions in the N-dimensional spectrum based on the peak subgroups in the merged list obtained in (v).

An increased number of peaks can be identified with this method. Usually, k will be chosen to be≧10, preferably around 100 or greater.

In order to reduce artifacts, it is preferred, that only candidate points are considered for which at least $S_{min}$ intersecting subspaces contribute.

Further artifacts can be reduced by carrying out after step (ii) and/or step (v) a ranking and deletion of subgroups.

It is advantageous when step (c) is carried out by an automated peak picking routine. No human interaction is required. The peak list can be obtained faster than manually while the precision of the results are improved.

In a preferred variant the peak position in the N-dimensional spectrum in step (vi) is the arithmetic average of w Intersections of subspaces, arising from x selected peaks from the corresponding subgroup, where $w \geq 1$. Therewith further improvement of precision can be achieved.

It is advantageous when step (d) is run simultaneously with step (b) and/or step (c), allowing step (d) to influence data recording and to stop the measurement when the N-dimensional peak list is determined. The expenditure of time can be reduced while increasing the precision.

The resulting N-dimensional peak list of step (d) can be used for automated sequence specific resonance assignments. This constitutes an application that excludes human resources and increases efficiency of assignments.

Furthermore the resulting N-dimensional peak list of step (d) can be used for automated structure determination. This application excludes human bias and increases efficiency of structure determination.

Further advantages can be extracted from the detailed description and the enclosed drawing. The features mentioned above and below can be used in accordance with the invention either individually or collectively in any combination. The embodiments mentioned are not to be understood as exhaustive enumeration but rather have exemplary character for the description of the invention.

The present invention combines technologies to record projections of high-dimensional NMR experiments described by Kupče and Freeman (see reference [15] as listed below) and automated peak-picking using a scheme of Herrmann et al. (see reference [22] as listed below) with a new algorithm, GAPRO geometric analysis of projections). Based on geometrical considerations, GAPRO identifies peaks in the projections that arise from the same resonance in the N-dimensional frequency space, and subsequently calculates the resonance frequencies in the N-dimensional spectrum without ever considering the high-dimensional data set itself. This automated analysis of projected spectra, APSY (automated projection spectroscopy), yields a peak list of the original multidimensional experiment without any human interaction. In the following sections, the foundations of APSY are introduced and characteristic properties of APSY are discussed. Two examples of APSY are a 4D HNCOCA experiment (see reference [24,25] as listed below) with the 63-residue protein 434-repressor (1-63) (see reference [26] as listed below), and a 5D HACACONH experiment (see reference [11] as listed below) with the 116-residue protein TM1290 (see reference [27] as listed below).

The invention is shown in the drawings.

BRIEF DESCRIPTION OF THE DRAWING

This is surrounded by five 1D cross sections at $\omega_3^0$ through the five experimental 2D projections of the 3D spectrum with projection angles $\alpha=0°, 45°, -25°$, and $-60°$. In FIG. 4a the grey dots mark the result for the cross sections of the automatic peak picking of the 2D projections (FIG. 3). The algorithm then arbitrarily selected N-1=2 of the j projections for the first round of spectral analysis (FIG. 3), with $\alpha=0°$ and $\alpha=-60°$. The intersections of the subspaces corresponding to the peaks in these two projections identify 8 candidate points C (open circles) in the 3D spectrum. Using the subspaces from all 5 projections, the support S (number of intersecting subspaces, see text) is calculated for each candidate point light colored dots and black squares indicate S=2 and S=5, respectively (FIG. 4b). In FIG. 4c one of the three candidate points C with the highest support (S=5) is arbitrarily selected. All peaks in the projections that contribute to the selected candidate point C are identified as a peak subgroup (dots in the projections labeled with number 1). The subspaces from this subgroup are removed (grey dashed lines) and the support S of remaining candidate points C is recalculated (there remains one point with S=5, and another one with S=4). After two more rounds of the procedure indicated in FIG. 4(c), two additional subgroups are identified and labeled with numbers 2 and 3, respectively (FIG. 4d). From the three subgroups, the positions of three peaks in the 3D spectrum are calculated (black dots in FIG. 4d).

Tab. 1 shows coordinates of the unit vector $\bar{p}_1$ used in the inventive method.

Figure 9:
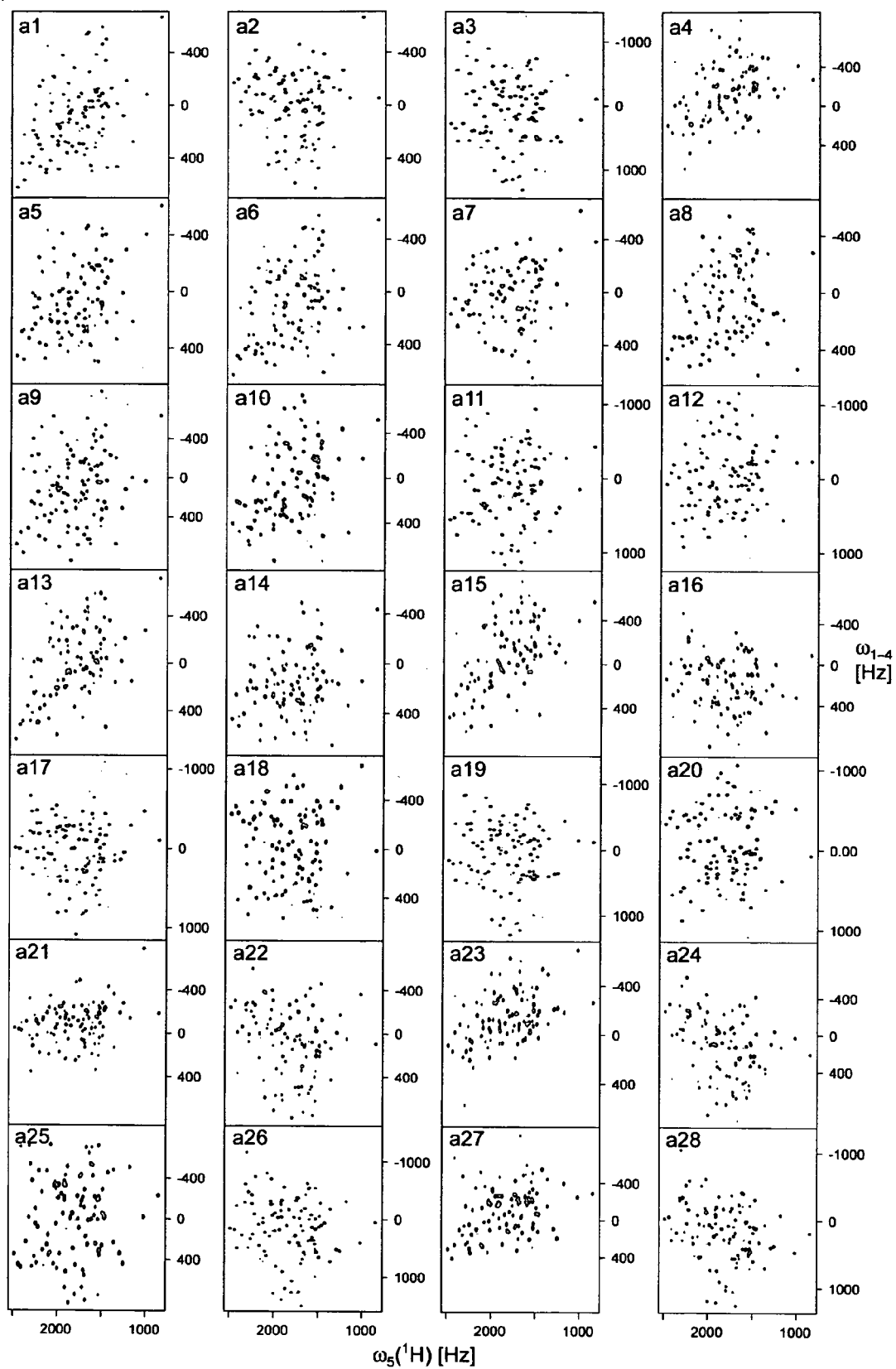
FIG. 9 shows 28 2D projections a1 to a28 of the 5D-APSY-HACACONH experiment measured using the scheme of FIG. 7 with the protein TM1290 on a 500 MHz spectrometer equipped with a z-gradient triple resonance cryogenic probehead. The dimension $\omega_{1-4}$ is the projection of the four indirect dimensions $\omega_1(^1H^{\alpha})$, $\omega_2(^{13}C^{\alpha})$, $\omega_3(^{13}C')$, and $\omega_4(^{15}N)$ obtained with the projection angles $\alpha$, $\beta$ and $\gamma$ (Tables 1 and 2). The scales are centered on the carrier frequencies of 118.0 ppm for $^{15}$N, 173.0 ppm for $^{13}$C', 54.0 ppm for $^{13}C^{\alpha}$, and 4.7 ppm for $^1$H. The projection angles and the spectral widths in the projected indirect dimension are given in Table 2. All projections are plotted with identical contour parameters.

Tab. 2 shows projection angles and spectral widths SWin ithe dimension $\omega_{1-4}$ used for recording the 28 2D projection spectra a1-a28, shown in FIG. 9. The spectral width SW in the projected indirect dimensions is calculated from $$SW = \sum_{z=1}^{4} p_1^z \cdot SW_z,$$

where the $p_1^z$s are the coordinates of the unit vector $\bar{p}_1$ (Eq. (1)) and the $SW_z$ are the spectral widths of the individual four indirect dimensions. The dimension $\omega_{1-4}$ is the projection of the four indirect dimensions $\omega_1(_1H^{\alpha})$, $\omega_2(^{13}C^{\alpha})$, $\omega_3(^{13}C')$ and $\omega_4(^{15}N)$ with the projection angles $\alpha$, $\beta$ and $\gamma$ (Tables 1 and 2).

Figure 5:
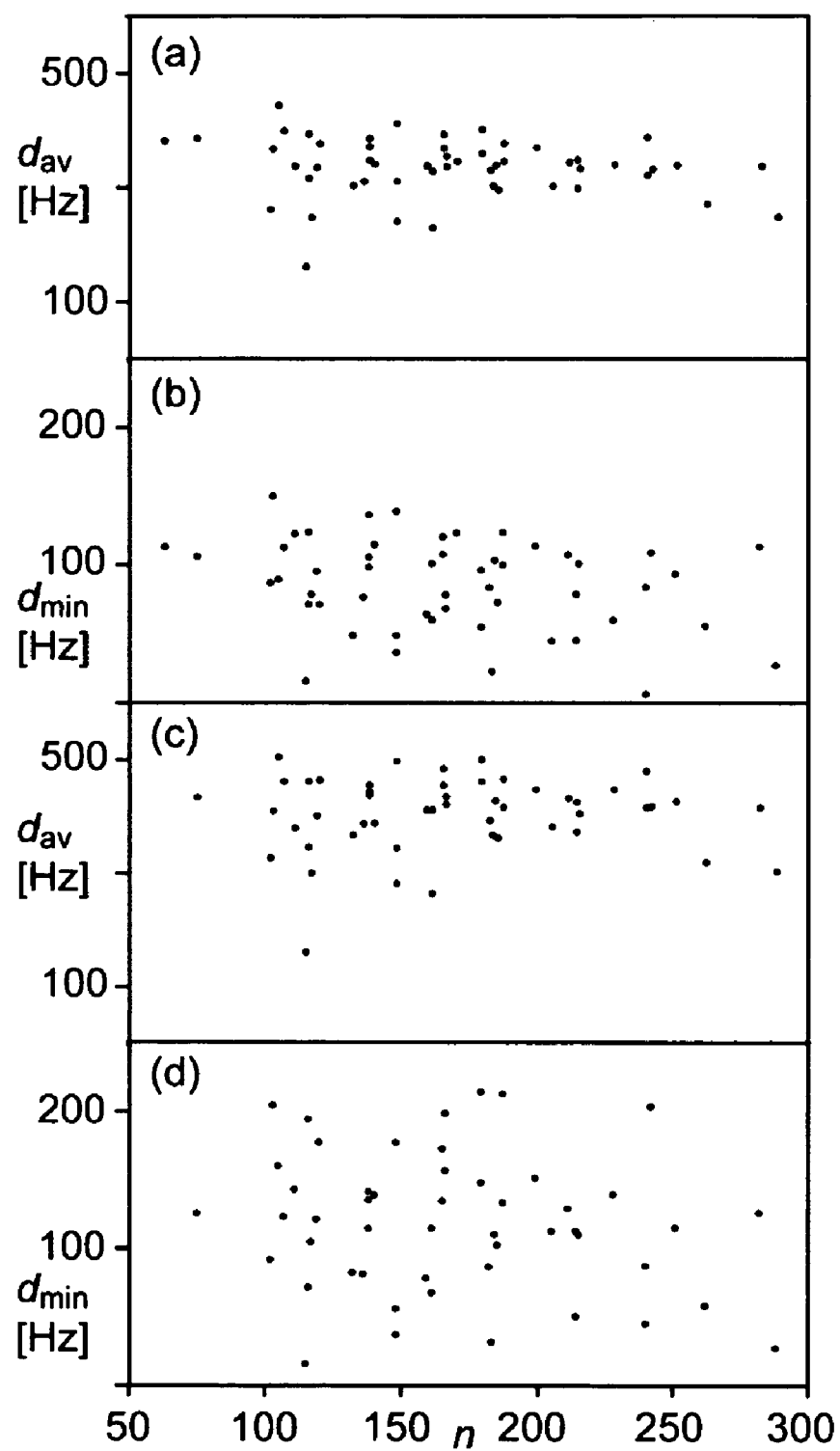
FIG. 5 shows a plots of peak separation in Hertz versus protein size (n is the number of residues). $d_{av}$ is the average distance to the closest peak, and $d_{min}$ is the distance between the closest pair of peaks. (a) and (b): 4D HNCOCA (c) and (d): 5D HACACONH. The calculations were based on the BMRB chemical shift deposits of 54 proteins (see Table 3), and assumed a $^1H$ frequency of 750 MHz. Gly residues are included only in (a) and (b).

Tab. 3 shows a data base of proteins used to generate the plot of FIG. 5. In addition to these 53 proteins, the chemical shifts of 434-repressor(1-63) (BMRB data 2539 and unpublished data) were used.

DESCRIPTION OF THE PREFERRED EMBODIMENT

Theoretical Background

Figure 1:
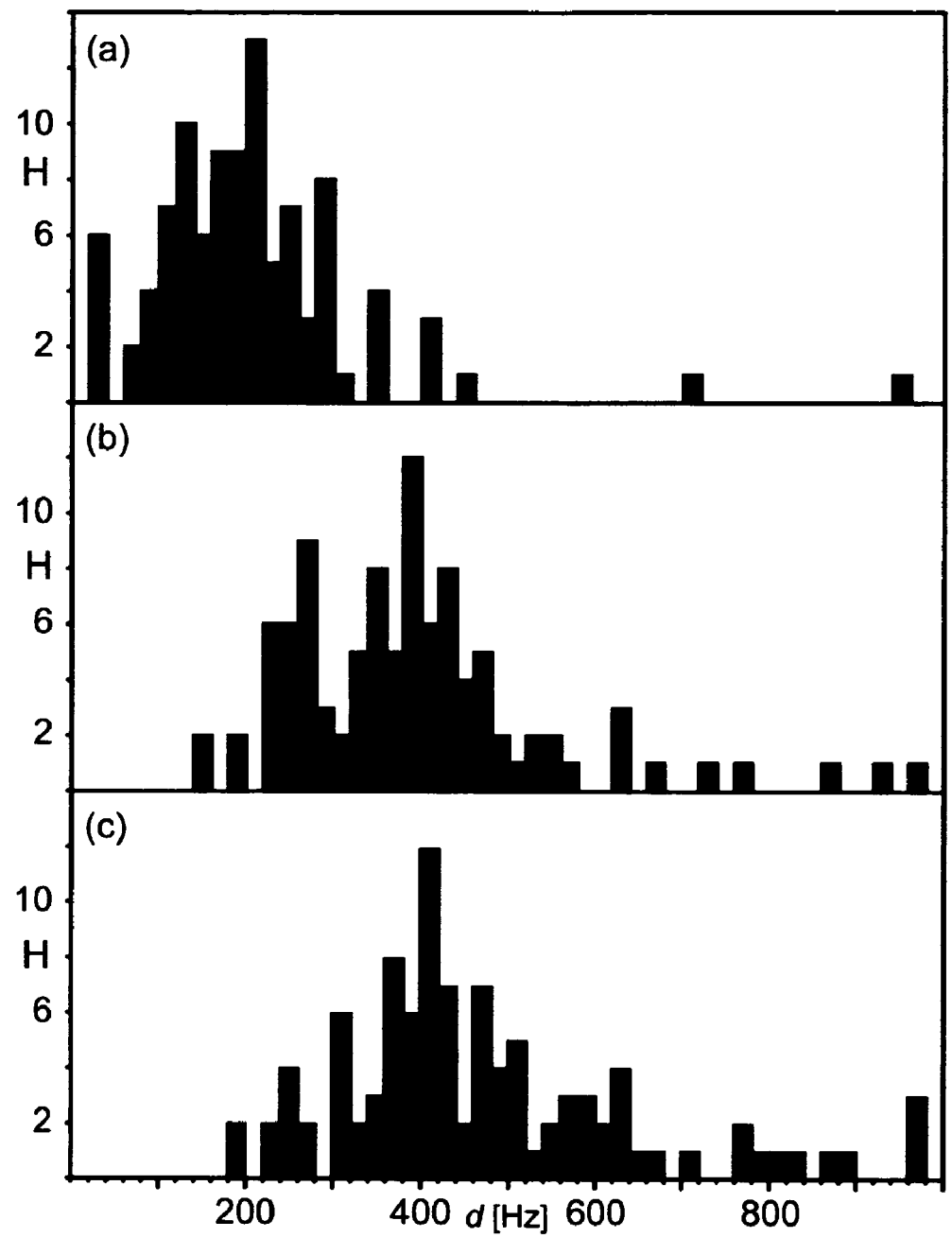
FIG. 1 shows a distribution of frequency differences, d, up to 1000 Hz between pairs of nearest cross peaks in multidimensional NMR spectra of the protein TM1290 for the following triple resonance experiments: (a) 3D HNCO, (b) 4D HNCOCA, (c) 5D HACACONH. H is the number of times a given value of d is expected. The calculations were based on the published chemical shift assignment of TM1290 (BMRB entry 5560) and assumed a field strength of 750 MHz.
Figure 2:
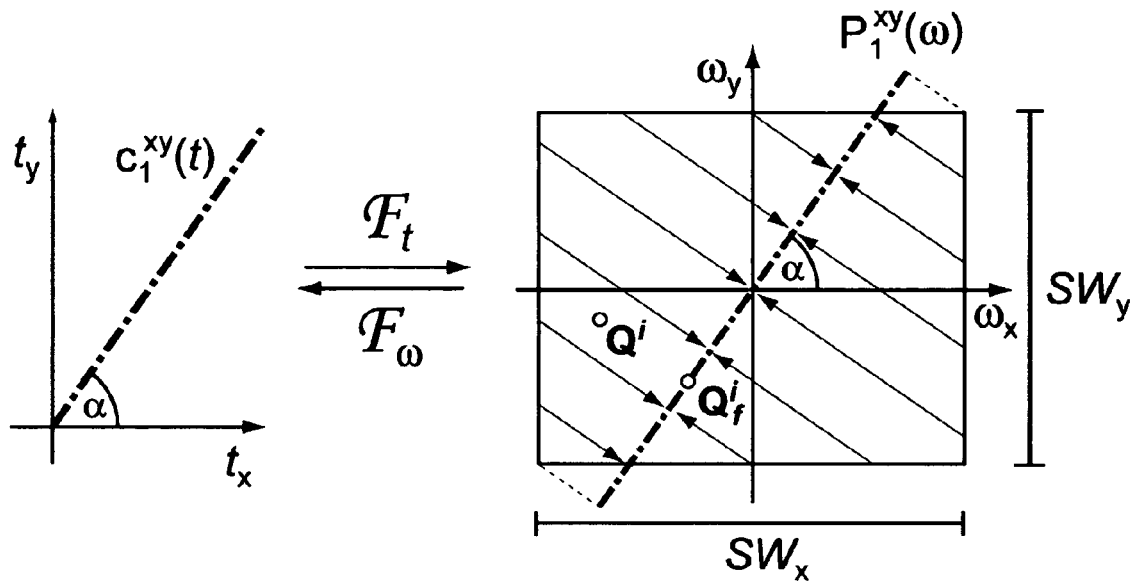
FIG. 2 shows an illustration of the projection—cross-section theorem (see reference [17-19] as listed below) for a 2D subspace of an N-dimensional frequency space with two indirect dimensions x and y. A one-dimensional signal $c_1^{xy}(t)$ on a straight line in the time domain $(t_x, t_y)$ (left) is related to a one-dimensional orthogonal projection $P_1^{xy}(\omega)$ of the spectrum $(\omega_x, \omega_y)$ in the frequency domain (right) by a one-dimensional Fourier transformation, $\mathcal{F}_t$, and the inverse transformation, $\mathcal{F}_\omega$. The projection angle $\alpha$ describing the slope of $c_1^{xy}(t)$ defines also the slope of $P_1^{xy}(\omega)$. The cross peak $Q^1$ appears at the position $Q_f^t$ in the projection f. Further indicated are the spectral widths in the two dimensions of the frequency domain, $SW_x$ and $SW_y$.

Recording of projection spectra. The projection-cross-section theorem by Bracewell (see reference [17] as listed below), which was introduced into NMR by Nagayama et al. (see reference [18] as listed below), states that an m-dimensional (m<N) cross section, cm(t), through N-dimensional time domain data is related by an m-dimensional Fourier transformation, $\mathcal{F}_t$, and its inverse, $\mathcal{F}_\omega$, to an m-dimensional orthogonal projection of the N-dimensional NMR spectrum, $P_m(\omega)$, in the frequency domain. Thereby, $P_m(\omega)$ and $c_m(t)$ are oriented by the same angles with regard to their corresponding coordinate systems (FIG. 2). On this basis, Kupče and Freeman proposed to record projections $P_m(\omega)$ by sampling the corresponding time domain data, $c_m(t)$, along a straight line (dashed line in FIG. 2). Quadrature detection is obtained from corresponding positive and negative projection angles for the subsequent hypercomplex Fourier transformation (see reference [15] as listed below).

Projections of cross peaks. Here 2D projections, $P_2(\omega)$, of an N-dimensional spectrum (N>2) are described. $P_2(\psi)$ represents spectral data in a 2D plane, which is spanned by an indirect dimension with unit vector $\bar{p}_1$, and the direct dimension, with $\bar{p}_2$. The indirect dimension is a 1D projection of the N−1 indirect dimensions. The same projection angles that parameterize the 2D time domain cross section, $c_2(t)$, with respect to the N time domain axes, define the position of $P_2(\omega)$ with respect to the N frequency axes (Table 1). For example, with N=5, the two unit vectors $\vec{p}_1$ and $\vec{p}_2$ are expressed in the coordinate system of the N-dimensional frequency space by $$\vec{p}_1^{N=5} = \begin{pmatrix} \sin(\gamma) \\ \sin(\beta) \cdot \cos(\gamma) \\ \sin(\alpha) \cdot \cos(\beta) \cdot \cos(\gamma) \\ \cos(\alpha) \cdot \cos(\beta) \cdot \cos(\gamma) \\ 0 \end{pmatrix} \quad (1)$$

and $$\vec{p}_2^{N=5} = \begin{pmatrix} 0 \\ 0 \\ 0 \\ 0 \\ 1 \end{pmatrix}.$$

In the coordinate system of a 2D projection spectrum, $P_2(\omega)$, a projected cross peak $Q_f^i$ has the position vector $\overline{Q}_f^i = [v_{f,1}^i, v_{f,2}^i]$, with $v_{f,1}^i$ and $v_{f,2}^i$ being the chemical shifts along the projected indirect dimension and the direct dimension, respectively. If the origins of both the N-dimensional coordinate system and the 2D coordinate system are in all dimensions in the center of the spectral range, the position vector $\overline{Q}_f^i$ in the N-dimensional frequency space is $$\vec{Q}_f^i = v_{f,1}^i \cdot \vec{p}_1 + v_{f,2}^i \cdot \vec{p}_2 \quad (2)$$

The N-dimensional cross peak $Q^i$ is located in an (N−2)-dimensional subspace L, which is orthogonal to the projection plane at the point $Q_f^i$ (see FIG. 2). In APSY, a set of j projections is recorded. From each N-dimensional cross peak $Q^i$, a projected peak $Q_f^i$ (f=1, . . . , j) appears in each of the j projections. The set of projected peaks that arise from the same N-dimensional peak $Q^i$, $\{Q_1^i, \ldots, Q_j^i\}$, is defined as a peak subgroup of $Q^i$. Once the subgroup is known and contains a sufficiently large number of elements, the coordinates of $Q^i$ can be calculated from the intersections of the subspaces from all subgroup elements. For 2D projections, at least N−1 elements are needed.

Figure 3:
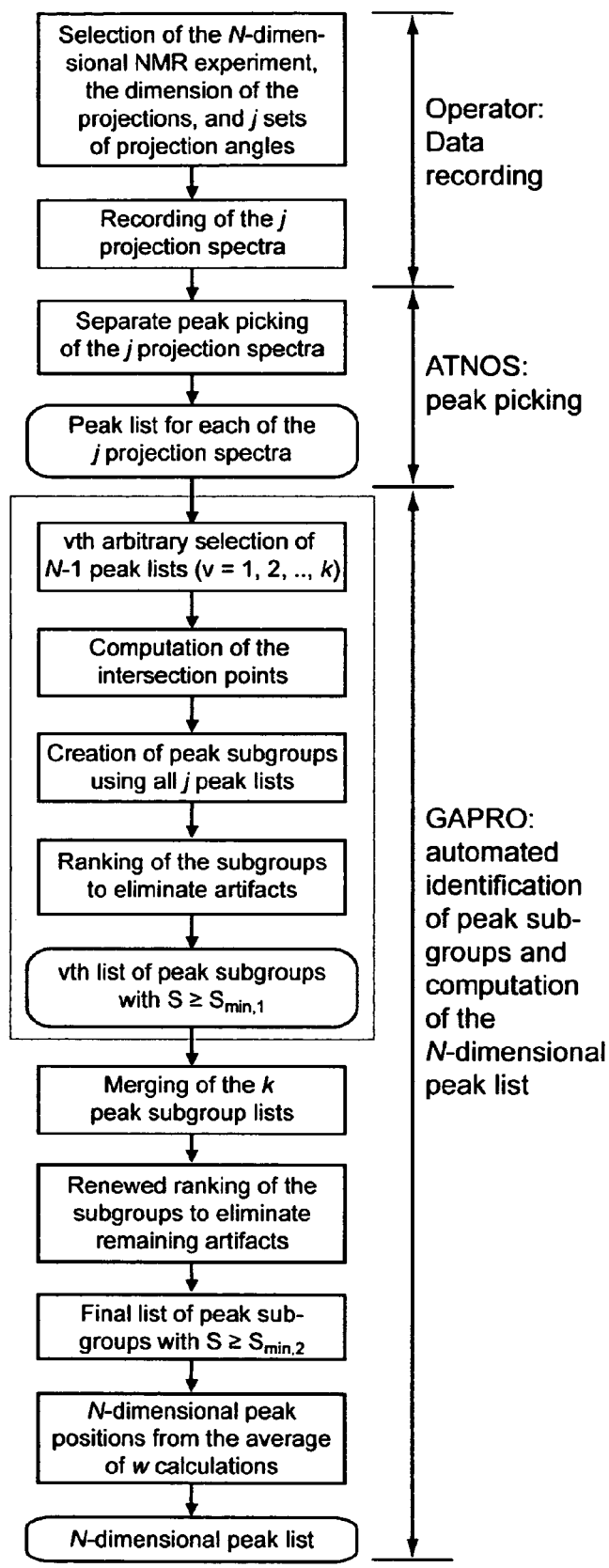
FIG. 3 shows a flowchart of APSY. Square boxes indicate processes, and boxes with rounded corners denote intermediate or final results. The steps highlighted in grey are repeated k times, and thus generate k lists of peak subgroups.
Figure 4:
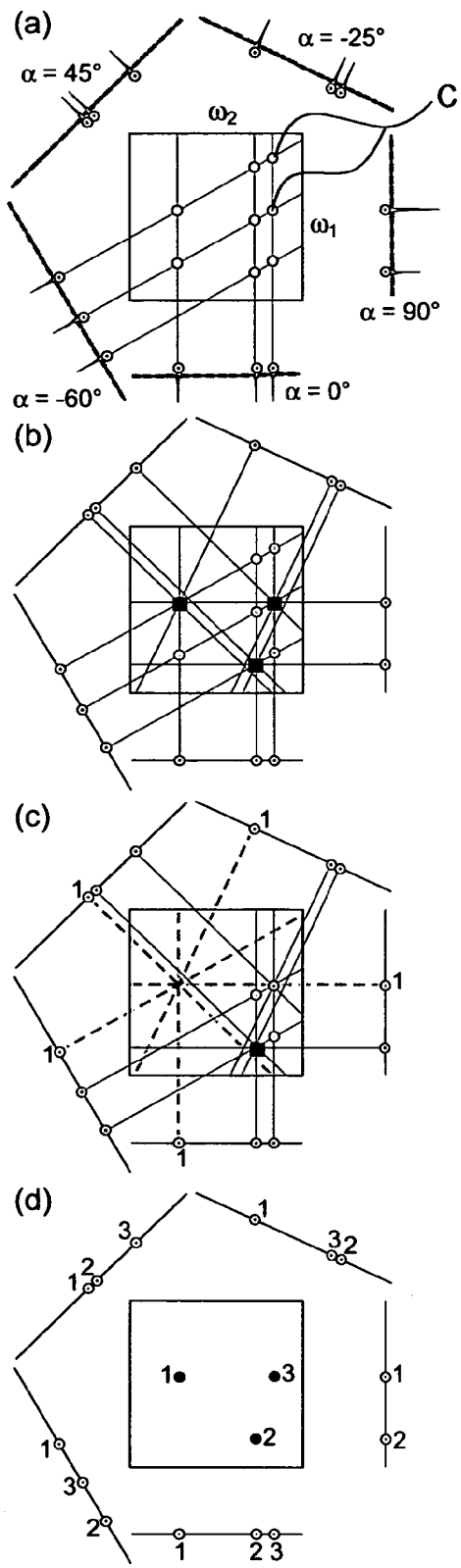
FIGS. 4a to 4d show an illustration of the algorithm GAPRO for N=3, j=5, k=1 and $S_{min,1}=3$ (see FIG. 3). The two indirect dimensions are in the paper plane, and the acquisition dimension $\omega_3$ is orthogonal to it. The central part of each panel shows a 2D $(\omega_1, \omega_2)$-cross section at the frequency $\omega_3^0$ through the 3D spectrum.

The APSY procedure. The procedure is outlined in FIG. 3 and illustrated in FIG. 4. The operator selects the desired N-dimensional NMR experiment, the dimension of the projection spectra and j sets of projection angles (j≧N−1), and records the projection spectra. These are automatically peak picked using ATNOS (see reference [22] as listed below), which yields j peak lists. These lists contain the peaks $Q_{gf}$, where g is an arbitrary numeration of the peaks in each projection f (f=1, . . . , j). GAPRO arbitrarily selects N−1 from among these peak lists, and generates the subspaces $L_{gf}$ that are associated with the peaks $Q_{gf}$ in these projections (FIG. 4a). The intersections of the subspaces $L_{gf}$ in the N-dimensional space are candidates for the positions of N-dimensional cross peaks (open circles in FIG. 4a), where the number of candidate points C typically exceeds the number of peaks in the spectrum. For each of these candidate points, the support, S, is then calculated as the number of subspaces from all j projections that intersect at this point. Thereby at most one subspace from each projection is considered (FIG. 4b; see text below), so that N−1≦S≦j. The peaks $Q_f^i$ associated with the subspaces that contribute to the support of a given candidate point C form a "peak subgroup". The subgroups are ranked for high S-values, and the top-ranked subgroup is selected (in case of degeneracy, one of the top-ranked subgroups is arbitrarily selected). The subspaces originating from the peaks $Q_f^i$ in this subgroup are removed, and new S-values for the residual candidate points C are calculated from the remaining subspaces (FIG. 4c). This procedure is repeated until the value of S for all remaining candidate points C falls below a user-defined threshold, $S_{min,1}$, at which point a list of peak subgroups is generated. The subgroup identification is repeated with k different, randomly chosen starting combinations of N−1 projections (the user-defined parameter k is a small fraction of the total number of possible combinations of N−1 projections), and k peak subgroup lists are thus obtained (grey box in FIG. 3). These lists are merged into a single list, which is again subjected to the same type of ranking procedure, so that all subgroups With $S<S_{min,2}$ are eliminated. From the resulting "final" list of subgroups, the peak positions in the N-dimensional space are calculated (FIG. 4d). In the following, the computational techniques used for individual steps in FIG. 3 are described.

Intersection of subspaces. To simplify the mathematical treatment, a (N-l)-dimensional subspace L (1<l<N) is described by a point $Q^L$ in this subspace and a set of orthonormal vectors, $\{\vec{p}_1^L, \ldots, \vec{p}_l^L\}$, orthogonal to L To intersect, for example, four 3D subspaces in 5D frequency space, two of the 3D subspaces can intersect to a 2D subspace, which can then intersect with one of the remaining 3D subspaces to a 1D subspace, which can intersect with the fourth 3D subspace to a point.

L and M are two subspaces of dimensionality (N−1) and (N−m), with (1<l−N) and (1<m<N). L is described by $\{\vec{p}_1^L, \ldots, \vec{p}_l^L\}$ and the point $Q^L$, M by $\{\vec{p}_1^M, \ldots, \vec{p}_m^M\}$ and $Q^M$. Both L and M are orthogonal to the direct dimension, and therefore both $\{\vec{p}_1^L, \ldots, \vec{p}_l^L\}$ and $\{\vec{p}_1^M, \ldots, \vec{p}_m^M\}$ include the unit vector of the direct dimension. If Eqs. (3) and (4) are satisfied, the subspaces L and M intersect in a subspace K of dimensionality (N−k), with k=l+m−1:

$$|Q^L(N) - Q^M(N)| \leq \Delta v_{min} \quad (3)$$

$$\dim\{\vec{p}_1^L, \ldots, \vec{p}_l^L, \vec{p}_1^M, \ldots, \vec{p}_m^M\} = l+m-1 \quad (4)$$

$Q^L(N)$ and $Q^M(N)$ are the Nth coordinates of $Q^L$ and $Q^M$, respectively, $\Delta v_{min}$ is a user-defined intersection tolerance in the direct dimension, and dim stands for "dimension of." Eq. (4) implies that $\{\vec{p}_1^L, \ldots, \vec{p}_l^L\}$ and $\{\vec{p}_1^M, \ldots, \vec{p}_m^M\}$ share only the direct dimension. The subspace K is then described by the orthdnormal basis $\{\vec{p}_1^K, \ldots, \vec{p}_k^K\}$, and by a point $Q^K$ with its coordinates 1 to (N−1) given by the l+m scalar products of Eq. (5):

$$\vec{p}_j^L \cdot (\overrightarrow{Q^K Q^L}) = 0 \quad j=1, \ldots, l$$

$$\vec{p}_j^M \cdot (\overrightarrow{Q^K Q^M}) = 0 \quad j=1, \ldots, m$$

The Nth coordinate of $Q^K$ is the arithmetic average of the Nth coordinates of $Q^L$ and $Q^M$.

Distance between a point and a subspace. The distance r between a point Q and a (N−l)-dimensional subspace L, as described by a point $Q^L$ and an orthonormal set of vectors orthogonal to L, $\{\vec{p}_1^L, \ldots, \vec{p}_l^L\}$, is given by $$r = \sqrt{\sum_{i=1}^{l}\left(\vec{p}_i^L \cdot \overrightarrow{(QQ^L)}\right)^2} \quad (6)$$

Peak positions in the N-dimensional space. The fact that the peak positions are generally overdetermined by the experimental data is used to refine the peak coordinates. From each subgroup, N−1 elements are arbitrarily chosen and their associated subspaces intersected to yield the position of the N-dimensional peak (FIG. 4). This procedure is repeated w times, where w is a user-defined parameter. Because of the limited precision of the individual chemical shift measurements, this results in w slightly different peak positions, which are then averaged in each dimension to obtain the final positioning of the N-dimensional peak $Q^l$.

Materials and Methods

Sample preparation. [U-$^{13}$C,$^{15}$N]-labeled 434-repressor (1-63) was produced following published procedures (see reference [26,28] as listed below). For the NMR measurements, a 0.9 mM sample was prepared in 20 mM sodium phosphate buffer at pH 6.5. [U-$^{13}$C,$^{15}$N]-labeled TM1290 was produced as described (see reference [29] as listed below). A NMR sample with 3.2 mM protein concentration in 20 mM phosphate buffer at pH 6.0 was prepared. Both NMR samples contained 95%/5% H$_2$O/ D$_2$O and 0.1% NaN$_3$.

NMR spectroscopy. The NMR experimental schemes used are described below. A 4D APSY—HNCOCA experiment was recorded with the 434-repressor(1-63) at 30° C. on a Bruker DRX 750 MHz spectrometer equipped With a z-gradient triple resonance probe. The GAPRO algorithm was applied with the parameters $S_{min,1}=S_{min,2}=3$ (FIG. 3), k=100 (FIG. 3), w=400 (FIG. 3), $\Delta v_{min}=7.5$ Hz (Eq. (3)), a signal-to-noise threshold for ATNOS peak picking of $R_{min}=4.0$ (see reference [22] as listed below), and a minimal distance for subspace intersection of $r_{min}=100$ Hz. The calculation time for GAPRO on a standard PC running Linux with a 2.8 GHz Pentium 4 processor was approximately 10 min.

A 5D APSY-HACACONH experiment (see reference [11] as listed below) was recorded with the protein TM1290 at 40° C. on a Bruker DRX 500 MHz spectrometer equipped with a z-gradient triple resonance cryogenic probehead. The GAPRO algorithm was applied with the following parameters: $S_{min,1}=S_{min,2}=4$. k=100, w=800, $\Delta v_{min}=5$ Hz, $R_{min}=8.0$, $r_{min}=50$ Hz. The GAPRO calculation time was approximately 30 min.

Example experimental schemes for APSY NMR

Figure 6:
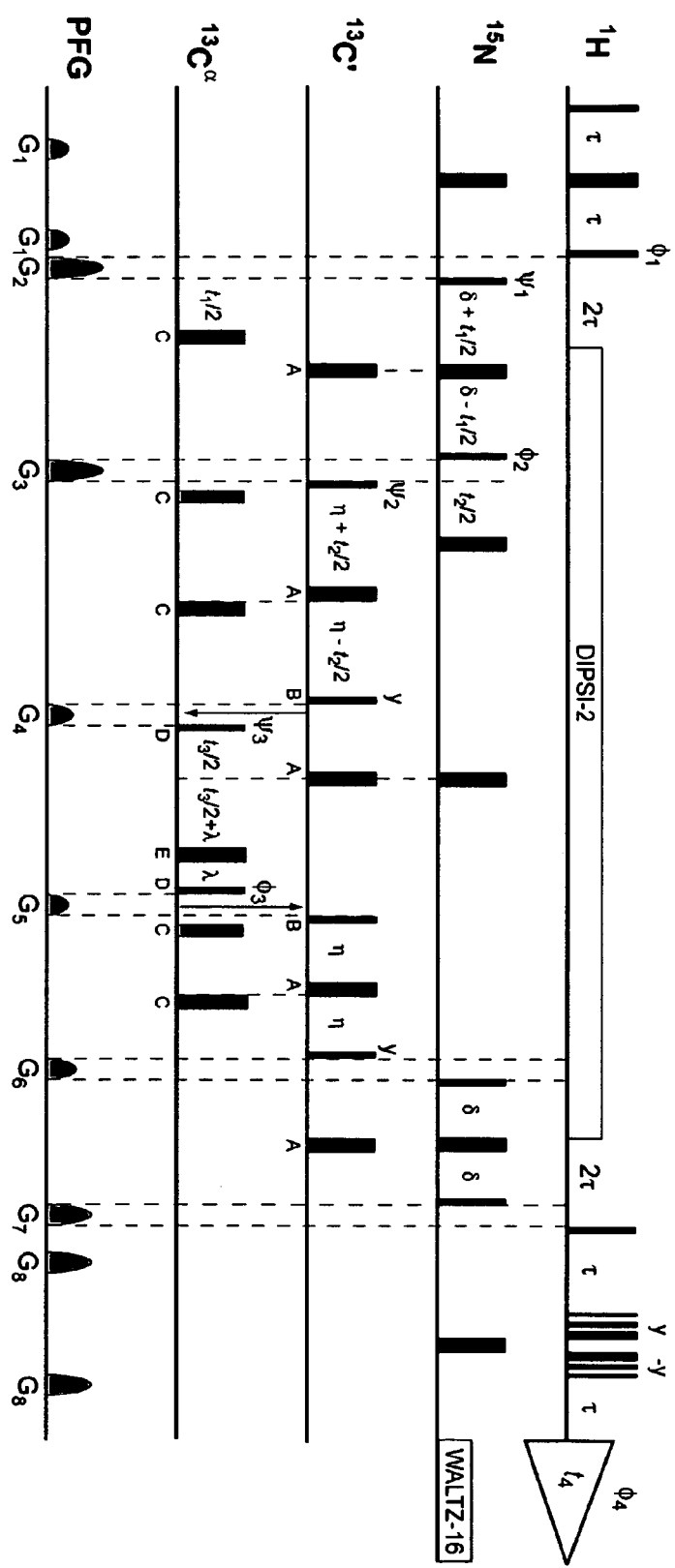
FIG. 6 shows a pulse sequence used for 4D APSY-HNCOCA. Radio-frequency pulses were applied at 118.0 ppm for $^{15}N$, at 174.0 ppm for $^{13}C'$, at 56.0 ppm for $^{13}C^\alpha$, and at 4.7 ppm for $^1H$. The carrier frequency on the carbon channel was switched between the $^{13}C'$ and $^{13}C^\alpha$ carrier positions where indicated by the two vertical arrows. Narrow and wide bars represent 90° and 180° pulses, respectively. Pulses marked with an upper case letter were applied as shaped pulses; A: Gaussian shape, duration 100 µs; B: Gaussian shape, 120 µs; C:I-burp (9), 200 µs; D: Gaussian shape, 80 µs; E: RE-burp (9), 350 µs (durations depend on the spectrometer frequency, here 750 MHz). All other pulses were rectangular pulses applied with high power. The last six $^1H$ pulses represent a 3-9-19 WATERGATE element (10). Grey $^{13}C^{\alpha}$-pulses were applied to compensate for off-resonance effects of selective pulses (11). Decoupling using DIPSI-2 (12) on $^1$H and WALTZ-16 (13) on $^{15}$N is indicated by rectangles. $t_4$ is the acquisition period. On the line marked PFG, curved shapes indicate sine bell-shaped pulsed magnetic field gradients applied along the z-axis, with the following durations and strengths: $G_1$, 700 µs, 13 G/cm; $G_2$, 1000 µs, 35 G/cm; $G_3$, 1000 µs, 35 G/cm; $G_4$, 800 µs, 16 G/cm; $G_5$, 800 µs, 13 G/cm; $G_6$, 800 µs, 18 G/cm; $G_7$, 1000 µs, 28 G/cm; $G_8$, 1000 µs, 28 G/cm. Phase cycling: $\phi_1=\{y, -y\}$ $\phi_2=\{x, x, -x, -x\}$, $\phi_3=\{4x, 4-x\}$, $\phi_4=\{x, -x, -x, x, -x, x, x, -x\}$, all other pulses =x. The following delays were used: $\tau=2.7$ ms, $\delta=13.75$ ms, $\eta=4.5$ ms, $\lambda=50$ µs. The indirect evolution times $t_1$-$t_3$ were incremented according to the projections angles $\alpha$ and $\beta$ (see text and Table 1). Quadrature detection for the indirect dimensions was achieved using the hyperoomplex Fourier transformation method for projections (14), with the phases $\psi_1$-$\psi_3$.

The pulse sequence for the 4D APSY-HNCOCA experiment (FIG. 6) was derived from the pulse sequence for 3D HN(CO)CA (see reference [24] as listed below) by adding an evolution period for $^{13}$C', similar to 4D TROSY-HNCOCA (see reference [25] as listed below). At a $^1$H frequency of 750 MHz, the three indirect dimensions $\omega_1(^{15}N)$, $\omega_2(^{13}C')$ and $\omega_3(^{13}C^\alpha)$ were recorded with spectral widths of 1600 Hz, 1900 Hz and 5700 Hz, respectively, and projected onto one indirect dimension using two projection angles α and β (Table 1). The interscan delay was 1s, and 8 transients were accumulated per data point in the indirect dimension. 1024 complex points were recorded in the direct dimension, with a sweep width of 11.0 ppm. Prior to Fourier transfomnation, the FID was multiplied with a 75°-shifted sine bell (see reference [30] as listed below) and zero-filled to 2048 complex points. In the indirect dimension, the data was multiplied with a 75°-shifted sine bell and zero-filled to the nearest-next power of 2 complex points before Fourier transformation (see reference [31] as listed below). The spectra were phased automatically using PROSA (see reference [32] as listed below). The baseline was corrected using the IFLAT method (see reference [33] as listed below) in the direct dimension and polynomials in the indirect dimension. j=27 projections were recorded with the following projection angles α and β, and numbers of complex points in the indirect dimension, n: (α, β, n)=(0°, 0°, 42), (0°, 90°, 48), (90°, 0°, 16), (±30°, 0°, 40), (±60°, 0°, 24), (0°, ±30°, 64), (0°, ±60°, 48), (90°, ±30°, 44), (90°, ±60°, 54), (±30°, ±60°, 56), (±60°. ±60, 56), (±45°, ±30°, 64).

Figure 7:
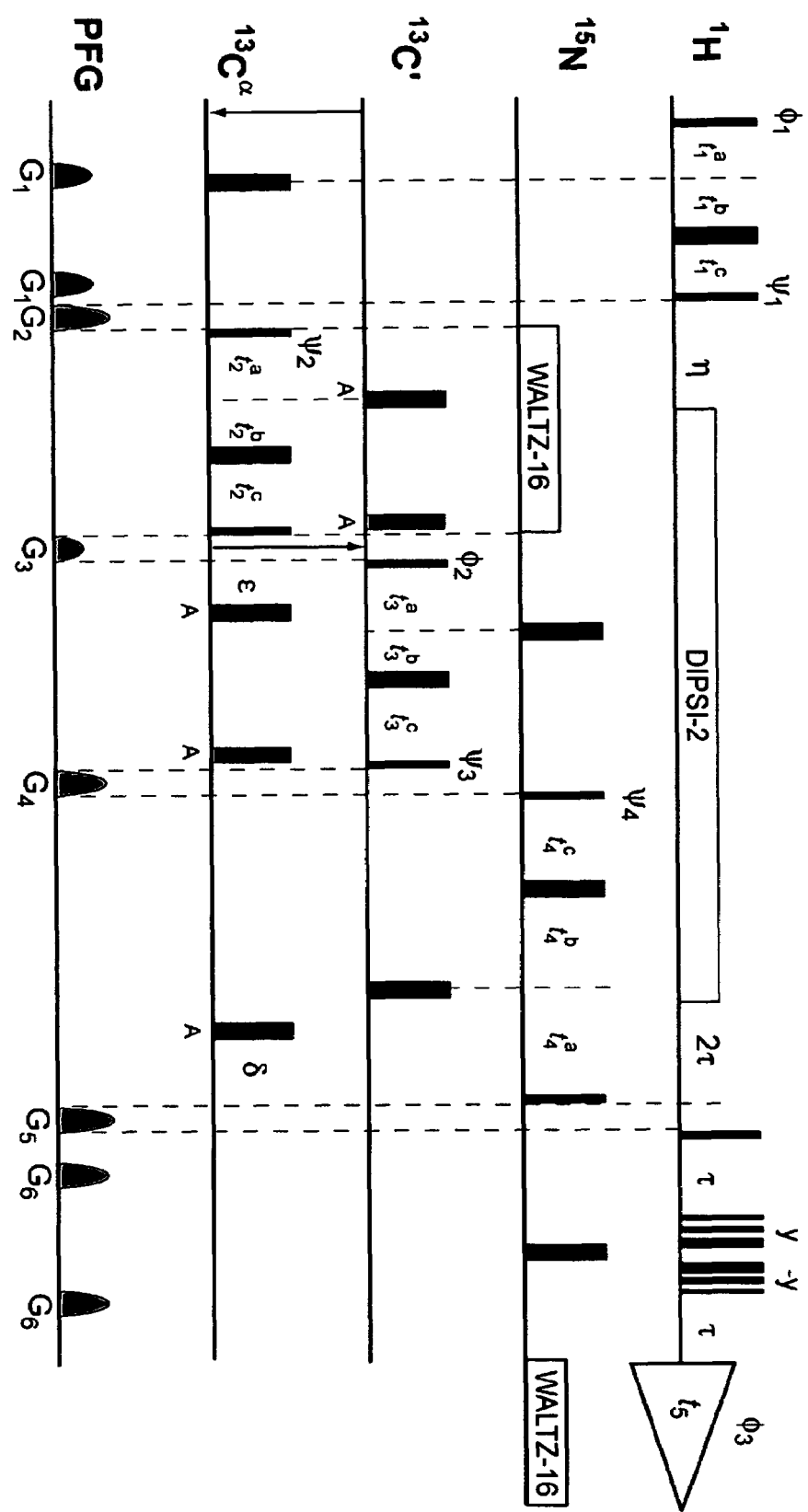
FIG. 7 shows a pulse sequence used for the 5D APSY-HACACONH experiment. Radio-frequency pulses were applied at 4.7 ppm for $^1$H. at 116.0 ppm for $^{15}$N, at 173.5 ppm for $^{13}$C' and at 52.5 ppm for $^{13}C^{\alpha}$. Narrow and Wide bars represent 90° and 180° pulses, respectively. Pulses marked "A" were applied as Gaussian shapes, with 120 µs duration at a $^1$H frequency of 500 MHz. All other pulses on $^{13}C^{\alpha}$ and $^{13}$C' had rectangular shape, with a duration of $\sqrt{3}/(\Delta\omega(C^{\alpha}, C').2)$ and $\sqrt{15}/(\Delta\omega(C^{\alpha}, C').4)$ for 90° and 180° pulses, respectively. Pulses on $^1$H and $^{15}$N were applied with rectangular shape and high power. The last six $^1$H pulses represent a 3-9-19 WATERGATE element (10). Grey pulses on $^{13}$C'and $^{13}C^{\alpha}$ were applied to compensate for off-resonance effects of selective pulses (11). Decoupling using DIPSI-2 (12) on $^1$H and WALTZ-16 (13) on 15N is indicated by rectangles. $t_5$ represents the acquisition period. On the line marked PFG, curved shapes indicate sine bell-shaped pulsed magnetic field gradients applied along the z-axis with the following durations and strengths: $G_1$, 800 µs, 18 G/cm; $G_2$, 800 µs, 26 G/cm; $G_3$, 800 µs, 13 G/cm; $G_4$, 800 µs, 23 G/cm; $G_5$, 800 µs, 26 G/cm; $G_6$, 800 µs, 23 G/cm. Phase cycling: $\phi_1=\{x, x, -x, -x\}$ $\phi_2=\{x, -x\}$, $\phi_3=\{x, -x, -x, x\}$, $\psi_1=y$, all other pulses=x. The following initial delays were used: $t_1^a=t_1^c=1.9$ Ms. $t_1^b=0$ ms, $t_2^a=4.7$ ms, $t_2^b=8.8$ ms, $t_2^c=13.5$ ms, $t_3^a=t_3^c=11.0$ ms, $t_3^b=0$ ms, $t_4^a=t_4^c=11.0$ ms, $t_4^b=0$ ms. The delays $\tau=2.7$ ms and $\eta=3.6$ ms were fixed, and the delays $\delta$ and $\epsilon$ were adjusted to $\delta=(t_4^a+t_4^b-t_4^c)/2$ and $\epsilon=4.7$ ms $+(t_3^a+t_3^b-t_3^c)/2$ during the experiment. In the indirect four dimensions, constant-time or semi-constant time evolution periods were applied, depending on the increment for the dimension resulting from the chosen projection angles $\alpha$, $\beta$ and $\gamma$ (Table 2). Quadrature detection for the indirect dimensions was achieved using the hyper-complex Fourier transformation method for projections (see reference[14] as listed below) with the phases $\psi_1$, $\psi_2$, $\psi_3$ and $\psi_4$ ($\psi_1$, $\psi_2$ and $\psi_3$ were incremented and $\psi_4$ was decremented in 90° steps).

In the 5D APSY-HACACONH experiment, the pulse sequence of Kim and Szyperski (see reference [11] as listed below) was modified to suppress magnetization pathways starting on glycine $H^\alpha$ (see reference [34] as listed below and FIG. 7). (Magnetization transfers starting at glycines produce peaks for which 4 of the 5 chemical shifts are identical, differing only in the $H^\alpha$-shift Such pairs of peaks would be very closely spaced in the multidimensional space. In principle, APSY could cope with this situation, possibly with adaptations in the choice of the projection angles or with modifications in the GAPRO algorithm.) At a $^1$H frequency of 500 MHz, the four indirect dimensions $\omega_1(^1H^\alpha)$, $\omega_2(^{13}C^\alpha)$, $\omega_3(^{13}C')$, and $\omega_4(^{15}N)$ were measured with spectral widths of 2000 Hz, 3600 Hz, 1600 Hz and 1550 Hz, respectively, and projected onto one indirect dimension using three projection angles α, β and γ (Table 1). In total, 28 projections were recorded With 128 complex points in the indirect dimension, using the parameters given in Table 2. The 28 projection spectra are shown in FIG. 9. The interscan delay was 1s, and 4 transients were accumulated per data point in the indirect dimension. 1024 complex points were recorded in the direct dimension with a spectral width of 12.0 ppm. The projection spectra were processed in the same way as described above for the 4D-APSY-HNCOCA experiment.

Peak picking. Automated peak picking of 2D projection spectra was performed with a peak picking routine derived from ATNOS (see reference [22] as listed be low), which recognizes all local maxima in the spectrum. In the 4D APSY-HNCOCA experiment, peaks from glutamine and asparagine side chains were eliminated by removing all pairs of peaks with the following parameters: proton chemical shifts in the range of 6.5-8.2 ppm, with chemical shift differences in the indirect dimension <10 Hz, and chemical shift differences in the direct dimension between 400 and 700 Hz.

Results

Figure 8:
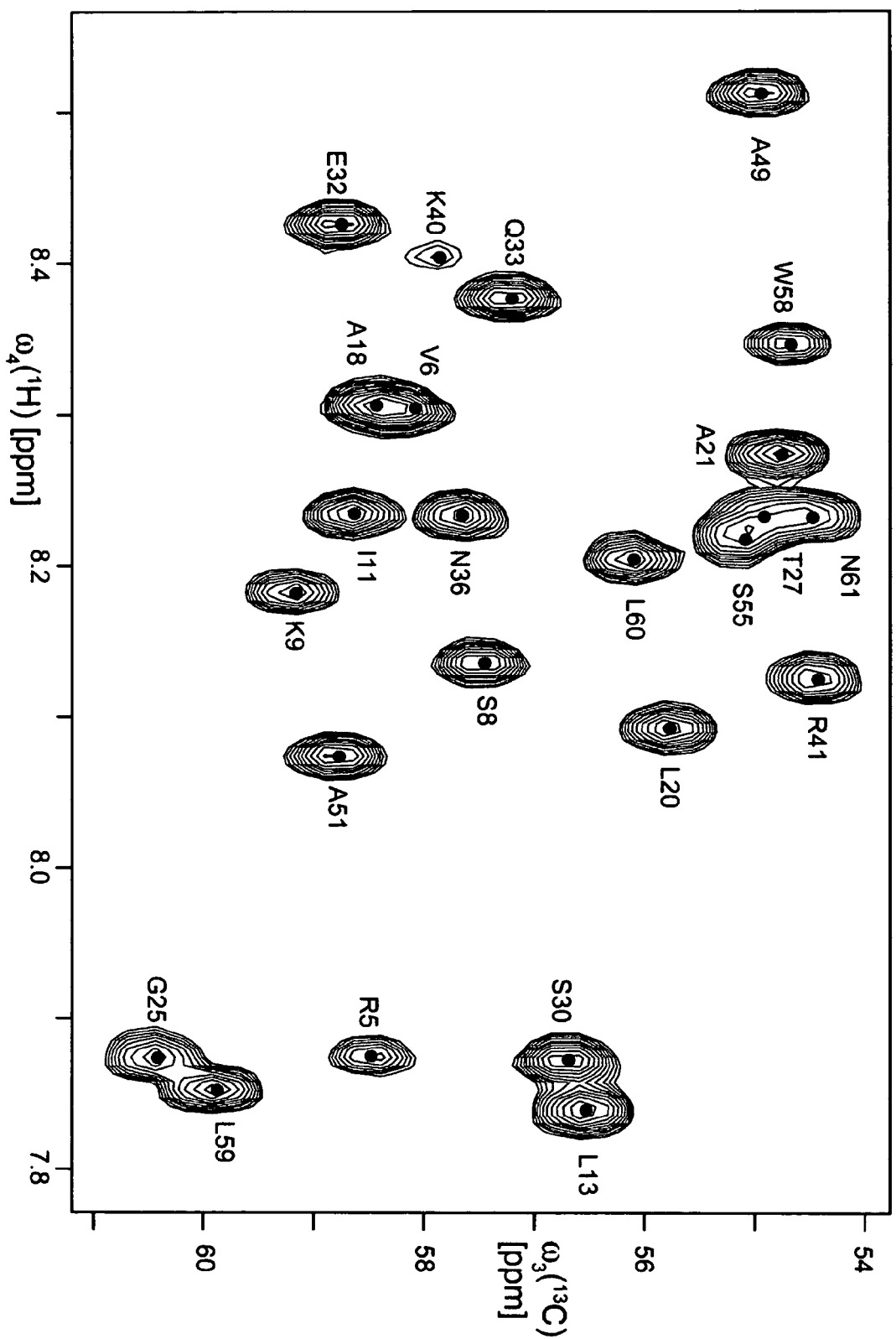
FIG. 8 shows a region of a 4D APSY—HNCOCA spectrum of 434-repressor(1-63) measured with the experimental scheme shown in FIG. 6. the projection was recorded with the angles $\alpha=0°$ and $\beta=90°$, which corresponds to a ($H^{N(i)}$, $C^{\alpha(i-1)}$) correlation spectrum. The spectral region shown contains 24 resonances that were all correctly identified by APSY in the associated 4D spas. The black dots indicate the peak coordinates from the final 4D APSY peak list. The assignment of the resonances is given using the one-letter amino acid code and the sequence number of the amide proton.

APSY-NMR spectroscopy is illustrated here with a 4D APSY-HNCOCA and a 5D APSY-HACACONH experiment. The 4D APSY—HNCOCA experiment was recorded with the 6.9 kDa protein 434-repressor(1-63). The pulse sequence used (FIG. 6) and further experimental details are given in Materials and Methods. In a total spectrometer time of 4 h, j=27 2D projections were recorded with the following projection angles (Table 1): (α, β)=(0°, 0°), (0°, 90°), (90°, 0°), (±30°, 0°), (±60°, 0°), (0°, ±30°), (0, ±60°), (90°, ±30°), (90°, ±60°), (±30°, ±60°), (±60°, ±60°), (±45°, ±30°). The projection spectra were peak picked with ATNOS (see reference [22] as listed below) to generate the input for GAPRO. The, 4D peak list that re-suited after about 15 minutes of GAPRO computation time, contained 59 peaks, which is to be compared with a total of 60 peaks expected from the chemical structure of the molecule. Although on average 18±9 noise artifacts were picked in each projection, the final 4D peak list generated by the GAPRO algorithm contained 59 cross peaks and not a single artifact (FIG. 8). Only the peak that would correlate the residues of the N-terminal dipeptide was missing. It had a signal intensity below the noise level in all projections. The precision of the chemical shifts in the final APSY peak list has been estimated to be 1 Hz in the direct dimension and 8 Hz in each of the three indirect dimensions.

The 5D APSY-HACACONH experiment was recorded with the 12.4 kDa protein TM1290. The pulse sequence used is described in Supplementary Material (FIG. 7), and further experimental details are given in Materials and Methods. In this experiment, 28 2D projections were recorded in 11 h. The projection angles and the spectral widths are given in Table 2, and the 28 2D projections are shown in FIG. 9. The final 5D peak list produced from the 5D APSY-HACACONH experiment with the protein TM1290 contained all the peaks that were expected from the chemical structure of the molecule and the previously published NMR assignments (see reference [29] as listed below), and there were no artifacts contained in the final peak list.

With the inventive method the foundations of automated projection spectroscopy (APSY) are presented, and the new algorithm GAPRO for automated spectral analysis is introduced. Then APSY for high-dimensional heteronuclear correlation NMR experiments with proteins has been implemented. In two applications without any human intervention after the initial set-up of the experiments, complete peak lists with high precision chemical shifts for 4D and 5D triple resonance spectra has been obtained. For the future, it is anticipated that APSY will be the first step, after protein preparation, in a fully automated process of protein structure determination by NMR. In addition to providing automated peak picking and computation of the corresponding chemical shift lists, as described herewith, APSY is expected to support automated sequential resonance assignment. For these envisaged goals, APSY has the promise of being a valid alternative to related NMR techniques that have recently been introduced for similar purposes. Thus, when compared to PR-NMR (see reference [13-16] as listed below), APSY has the advantage of relying exclusively on the analysis of experimental low-dimensional projection spectra, with no need to ever reconstruct the parent high-dimensional spectrum. When compared to GFT-NMR (see reference [11] as listed below), APSY differs in that there are no restrictions on the selection of the number of projections or the combinations of projection angles. The strongest asset of APSY, however, is that the new algorithm GAPRO enables fully automated analysis of the experimental projection spectra. As a primary result, complete peak picking and computation of high precision chemical shift lists are obtained without any bias that could result from human intervention.

APSY and protein size. APSY has so far been applied to the 6.9 kDa protein 434-repressor(1-63) (FIG. 8) and the 12.4 kDa protein TM1290 (FIG. 9, Table 2). To obtain an estimate of possible limitations for APSY applications with larger proteins due to spectral overlap, the peak separations in 4- and 5- dimensional triple resonance spectra of a sample of 54 proteins with sizes from n=50 to 300 residues have been analyzed Table 3), which were simulated from the BMRB chemical shift deposits. Considered were the average of the distances from each peak to its nearest-by neighbor, $d_{av}$, and the distance between the two most closely spaced peaks in the entire spectrum, $d_{min}$. FIG. 5 represents the data for the two experiments 4D HNCOCA and 5D HACACONH. There is no obvious correlation between n and either $d_{av}$ or $d_{min}$, indicating that close approach of peaks is distributed statistically and depends on particular properties of the protein, irrespective of its size. In FIG. 5, the statistical probability to encounter pairs of peaks that could not be resolved by APSY is less than 1% for protein sizes up to at least 300 residues, which is representative for 4D and 5D triple resonance data sets that contain one peak per residue. Foreseeably, sensitivity of signal detection will therefore be a more stringent limitation for APSY applications than spectral crowding. From our experience to-date, projection spectra with a signal-to-noise ratio of approximately 3:1 are required for efficient use of APSY with automated peak picking.

For the few expected closely spaced pairs of peaks, APSY is in a good position to resolve potential difficulties, since it is not required that a given N-dimensional resonance is found in all projection spectra. Peaks with overlap in one or several projections will usually be resolved in many other projections (FIG. 4). Similar to GFT-NMR (see reference [11] as listed below), APSY is also well prepared to deal with inaccurate peak positions from automated peak picking, which may arise from peak overlap. Since the final N-dimensional APSY peak list is computed as the average of a large number of measurements (FIG. 3), inaccurate peak positions in some of the projections have only a small influence on the overall precision.

APSY and spectral artifacts. The positions of the peaks belonging to a peak subgroup (FIG. 3) are correlated in all the projection spectra, whereas, in contrast, the positions of random noise are uncorrelated. This different behavior of the two types of peaks, which cannot readily be distinguished in the initial automatic peak picking, efficiently discriminates against artifacts. Artifacts are therefore unlikely to pass through the ranking filters (FIG. 3) and thus to appear in the final peak list. For the two APSY applications presented in this study, the final peak lists contained no artifacts, although the initial peak picking routine was applied with low signal-to-noise thresholds, $R_{min}$, and included a large number of spurious signals in the initial peak lists. This result supports that the presently used ranking criteria (FIG. 3) were well chosen.

Outlook to future implementations of APSY. The present set-up of an APSY experiment (FIG. 3) requires the operator to define seven parameters, in addition to the selection of the N-dimensional experiment, the number and dimension of the projections, and the projection angles. These are the signal-to-noise threshold, $R_{min}$, for ATNOS peak picking, the thresholds for the two ranking filters, $S_{min,1}$, and $S_{min,2}$, the number of subgroup list calculations, k, the number of final peak coordinates calculations, w, the minimal distance for intersections, $r_{min}$, and the intersection tolerance in the direct dimension, $\Delta v_{min}$. For routine use of APSY, optimized sets of these parameters will emerge, and some of the free variables might be replaced by novel convergence criteria. Further refinements will also apply to selecting optimal numbers of and dimensions for the projections, as well as to identifying optimal combinations of projection angles for given experimental situations. This may include consideration of the different relaxation properties of the nuclei involved, leading to the use of projection angles with short evolution times for the most rapidly relaxing spins. Further technical improvements may lead, for example, to higher spectral resolution by linear prediction, or to improved spectrometer time usage by concurrent data acquisition and date analysis, with feedback to prevent unneeded data accumulation once the final peak list converges.

With the present invention an APSY method (automated projection spectroscopy) for the recording of discrete sets of j projections from N-dimensional (N≧3) NMR experiments at operator-selected projection angles, and automatic identification of the correlation cross peaks is presented. The result from APSY is the fully automated generation of the complete or nearly complete peak list for the N-dimensional NMR spectrum from a geometric analysis of the j experimentally recorded, low-dimensional projections. In the present implementation of APSY, two-dimensional projections of the N-dimensional spectrum are recorded, using techniques developed for projection-reconstruction spectroscopy (see reference [15] as listed below). All projections can be peak-picked with the available automated routine ATNOS (see reference [22] as listed below). The new algorithm GAPRO (geometric analysis of projections) uses vector algebra to identify subgroups of peaks in different projections that arise from the same resonance in the N-dimensional spectrum, and from these subgroups it calculates the peak positions in the N-dimensional frequency space. Unambiguous identification can thus be achieved for all cross peaks that are not overlapped with other peaks in at least one of the N dimensions. Because of the correlation between the positions of corresponding peaks in multiple projections, uncorrelated noise is efficiently suppressed, so that APSY should be quite widely applicable for correlation spectra of biological macromolecules, which have intrinsically low peak density in the N-dimensional spectral space

REFERENCES

Wüthrich, K. (1986) NMR of Proteins and Nucleic Acids (Wiley, New York).
[2] Bax, A. & Grzesiek, S. (1993) *Accts. Chem. Res.* 26, 131-138.
[3] Kay, L. E. & Gardner, K. H. (1997) *Curr. Opin. Struct. Biol.* 7, 722-731.
[4] Wüthrich, K (2003) *Angew. Chem. Int Ed.* 42, 3340-3363.
[5] Ernst, R. R., Bodenhausen, G. & Wokaun, A. (1987) *Principles of Nuclear Magnetic Resonance in One and Two Dimensions* (Oxford University Press, Oxford).
[6] Szyperski, T., Yeh, D.C., Sukumaran, D. K., Moselex, H. N. B. & Montelione, G. T. (2002) *Proc. Natl. Aced. Sci. USA* 99, 8009-8014.
[7] Orekhov, V. Y., Ibraghimov, I. & Billeter, M. (2003) *J. Biomol. NMR* 27, 165-173.
[8] Rovnyak, D., Frueh, D. P., Sastry, M., Sun, Z. Y. J., Stern, A &, Hoch, J. C. & Wagner, G. (2004) *J. Magn. Reson.* 170, 16-21.
[9] Szyperski, T., Wider, G., Bushweller, J. H. & Wothrich, K. (1993) *J. Am. Chem. Soc.* 116, 9307-9308.
[10] Freeman. R. & Kupoe, E. (2004) *Concepts Magn. Reson.* 23A, 63-75.
[11] Kim, S. & Szyperskl, T. (2003) J. Am. Chem. Soc. 125, 1385-1393.
[12] Kozminski, W. & Zhukov, I. (2003) *J. Biomol. NMR* 26, 157-166.
[13] Kupce, E. & Freeman, R. (2003) *J. Am. Chem. Soc.* 125, 13958-13959.
[14] Kupce, E. & Freeman, R. (2003) *J. Biomol. NMR* 27, 383-387.
[15] Kupoe, E. & Freeman, R. (2004) *J. Am. Chem. Soc.* 126, 6429-6440.
[16] Kupoe, E. & Freeman, R. (2004) *Concepts Magn. Reson.* 22A, 4-11.
[17] Bracewell, R. N. (1956) *Australian J. Phys.* 9, 198.
[18] Nagayama, K., Bachmann, P., Wüthrich, K. & Ernst, R. R. (1978) *J. Magn. Reson.* 31, 133-148.
[19] Mersereau, R. M. & Oppenheim, A. V. (1974) *Proc. IEEE* 62, 1319-1338.
[20] Lauterbur, P. C. (1973) *Nature* 242, 190-191.
[21] Koradi, R., Billeter, M., Engeli, M., Gontert, P. & Wüthrich, K. (1998) *J. Magn. Reson.* 135, 288-297.
[22] Herrmann. T., Gontert, P. & Wüthrich, K (2002) *J. Biomol. NMR* 24, 171-189.
[23] Baran, M. C., Huang, Y. J., Moseley, H. N. B. & Montelione, G. T. (2004) *Chem. Rev.* 104, 3541-3555.
[24] Grzesiek, S. & Bax, A. (1992) *J. Magn. Reson.* 96, 432-440.
[25] Yang, D. W. & Kay, L. E. (1999) *J. Am. Chem. Soc.* 121, 2571-2575.
[26] Neri, D., Billeter, M. & Wüthrich, K. (1992) *J. Mol. Biol.* 223, 743-767.
[27] Etezady-Esfarjani, T., Herrmann, T., Peti, W., Klock, H. E., Lesley, S. A. & Wüthrich, K. (2004) *J. Blomol. NMR* 29, 403-406.
[28] Neri, D., Szyperski, T., Otting, G., Senn, H. & Wüthrich, K (1989) Biochemistry 28, 7510-7516.
[29] Etezady-Esfarjani, T., Peti, W. & Wüthrich, K. (2003) *J. Biomol. NMR* 25, 167-168.
[30] De Marco, A. & Wüthrich, K (1976) *J. Magn. Reson.* 124, 201-204.
[31] Bartholdi, E. & Ernst, R. R. (1973) *J. Magn. Reson.* 11, 9-19.
[32] Güntert, P., Dötsch, V., Wider, G. & Wüthrich, K. (1992) *J. Biomol. NMR* 2, 619-629.
[33] Bartels, C., Güntert, P. & Wüthrich, K. (1995) *J. Magn. Reson.* A117, 330-333.
[34] Burum, D. P. & Ernst, R. R. (1980) *J. Magn. Reson.* 39, 163-168.
[35] Geen, H. & Freeman, R. (1991) *J. Magn. Reson.* 93, 93-141.
[36] Skienar, V., Piotto, M., Leppik, R. & Saudek, V. (1993) *J. Magn. Reson.* A102, 241-245.
[37] McCoy, M. A & Miller, L. (1992) *J. Magn. Reson.* 99, 18-36.
[38] Shaka, A. J., Lee, C. J. & Pines, A. (1988) *J. Magn. Reson.* 77, 274-293.
[39] Shaka, A. J., Keeler, J., Frenkiel, T. & Freeman, R. (1983) *J. Magn. Reson.* 52, 335-338.
[40] Moseley, H. N. B., Riaz, N., Aramini, J. M., Szyperski, T., & Montelione, G. T. (2004) *J. Magn. Reson.* 170, 263-277.

We claim:
1. A method of projection spectroscopy data recording for N-dimensional nuclear magnetic resonance (NMR) experiments, the method comprising the steps of:
  a) selecting N-dimensional NMR experiments out of a group of N-dimensional experiments, selecting dimensionalities ($D_i$) of projections, and unconstrained selecting of j sets of projection angles, wherein j≧2;
  b) recording discrete sets of j projections from the N-dimensional NMR experiments at the selected projection angles:
  c) peak picking and creating a peak list for each of the j projection spectra;
  d) automatically identifying peaks in the projection spectra that arise from a same resonance in the N-dimensional spectrum (N≧3) using vector algebra to exploit geometrical properties of projections in N-dimensional space and computing an N-dimensional peak list using vector algebra to exploit geometrical properties of the projections in the N-dimensional space, thereby determining resonance positions in N-dimensional frequency space; and e) storing the peak list of step d), wherein step d) comprises the steps of:

d1) computing candidate points (C), which are intersection points in the N-dimensional spectrum of subspaces arising from peaks in x selected peak lists from the j peak lists created in step c), wherein x is a smallest number that warrants an existence of intersection points;

d2) calculating a number S of intersecting subspaces for each candidate point (C) using all j peak lists;

d3) creating a peak subgroup list by identifying all peaks that contribute to a selected candidate point (C);

d4) repeating steps d1) to d3) k−1 times, wherein $k \geq 1$;

d5) merging the k peak subgroup lists; and d6) calculating peak positions in the N-dimensional spectrum based on peak subgroups of the peak subgroup lists in the merged list obtained in step d5).

2. The method of claim 1, wherein only candidate points (C) are considered for which at least $S_{min}$ intersecting subspaces contribute.

3. The method of claim 1, wherein a ranking and deletion of subgroups is carried out following step d2).

4. The method of claim 1, wherein a ranking and deletion of subgroups is carried out following step d5).

5. The method of claim 1, wherein step c) is carried out by an automated peak picking routine.

6. The method of claim 1, wherein the peak positions in the N-dimensional spectrum in step d6) is an arithmetic average of w intersections of subspaces, arising from x selected peaks from the corresponding subgroup, wherein $w \geq 1$.

7. A method of projection spectroscopy data recording for N-dimensional nuclear magnetic resonance (NMR) experiments, the method comprising the steps of:

a) selecting-dimensional NMR experiments out of a group of N-dimensional experiments, selecting dimensionalities ($D_i$) of projections, and unconstrained selecting of j sets of projection angles, wherein $j \geq 2$;

b) recording discrete sets of j projections from the N-dimensional NMR experiments at the selected projection angles:

c) peak picking and creating a peak list for each of the j projection spectra;

d) automatically identifying peaks in the projection spectra that arise from a same resonance in the N-dimensional spectrum ($N \geq 3$) using vector algebra to exploit geometrical properties of projections in N-dimensional space and computing an N-dimensional peak list using vector algebra to exploit geometrical properties of the projections in the N-dimensional space, thereby determining resonance positions in N-dimensional frequency space; and e) storing the peak list of step d), wherein step d) is run simultaneously with step b) and/or step c), allowing step d) to influence data recording and to stop measurement when the N-dimensional peak list is determined.

8. The method of claim 1, wherein the N-dimensional peak list of step d) is used for automated sequence specific resonance assignments.

9. The method of claim 1, wherein the resulting N-dimensional peak list of step d) is used for automated structure determination.

* * * * *

UNITED STATES PATENT AND TRADEMARK OFFICE
CERTIFICATE OF CORRECTION

PATENT NO. : 7,308,365 B2  Page 1 of 1
APPLICATION NO. : 11/439161
DATED : December 11, 2007
INVENTOR(S) : Francesco Fiorito It is certified that error appears in the above-identified patent and that said Letters Patent is hereby corrected as shown below:

On the Title page item [73] Assignee should read:

Bruker BioSpin AG, Faellanden, Switzerland.

Title page Item [74] should read:

Paul Vincent

Signed and Sealed this

Twenty-third Day of February, 2010

David J. Kappos
*Director of the United States Patent and Trademark Office*